United States Patent
Nickel et al.

(10) Patent No.: US 6,603,678 B2
(45) Date of Patent: Aug. 5, 2003

(54) THERMALLY-ASSISTED SWITCHING OF MAGNETIC MEMORY ELEMENTS

(75) Inventors: Janice H. Nickel, Sunnyvale, CA (US); Lung T. Tran, Saratoga, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/758,757

(22) Filed: Jan. 11, 2001

(65) Prior Publication Data

US 2002/0089874 A1 Jul. 11, 2002

(51) Int. Cl.[7] .............................................. G11C 11/14
(52) U.S. Cl. ...................... 365/171; 365/213; 365/212; 365/211; 365/209; 365/173
(58) Field of Search ................. 365/213, 212, 365/211, 209, 171, 173

(56) References Cited

U.S. PATENT DOCUMENTS

| | | | | |
|---|---|---|---|---|
| 5,224,068 A | * | 6/1993 | Miyake et al. ................ 360/59 |
| 5,396,455 A | * | 3/1995 | Brady et al. ................. 365/170 |
| 5,444,651 A | * | 8/1995 | Yamamoto et al. ......... 365/108 |
| 5,761,110 A | * | 6/1998 | Irrinki et al. ................ 365/100 |
| 5,933,365 A | * | 8/1999 | Klersy et al. ................ 365/148 |
| 5,936,882 A | * | 8/1999 | Dunn .......................... 365/158 |
| 5,953,245 A | * | 9/1999 | Nishimura ................... 365/145 |
| 5,956,295 A | * | 9/1999 | Yamakawa et al. ........... 256/16 |
| 6,016,290 A | | 1/2000 | Chen et al. |
| 6,051,851 A | * | 4/2000 | Ohmi et al. ................. 257/185 |
| 6,163,477 A | | 12/2000 | Tran |
| 6,385,082 B1 | * | 5/2002 | Abraham et al. ........... 365/171 |
| 2001/0019461 A1 | | 9/2001 | Appenspach et al. ......... 360/59 |

FOREIGN PATENT DOCUMENTS

WO     WO00/79540     12/2000

* cited by examiner

Primary Examiner—Van Thu Nguyen

(57) ABSTRACT

A magnetic memory element is written to by heating the memory element and applying at least one magnetic field to the memory element. The memory element is heated via heating lines which can be formed in a single path or plurality of paths. Each path has one end tied to a reference potential, and the other end coupled to a current source via a transistor.

10 Claims, 7 Drawing Sheets

FIG. 1
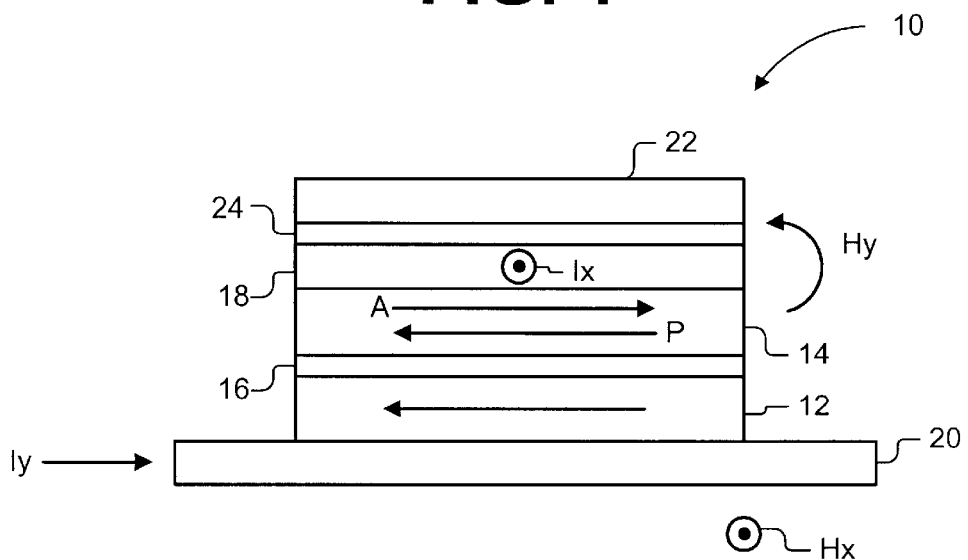
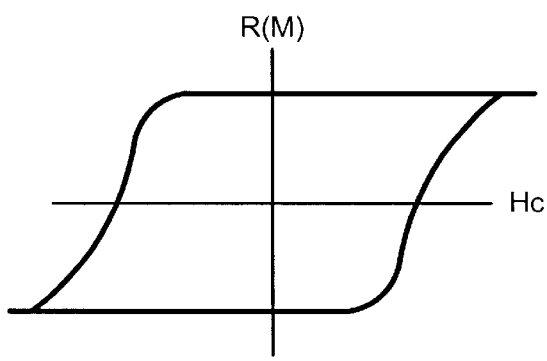
FIG. 2a
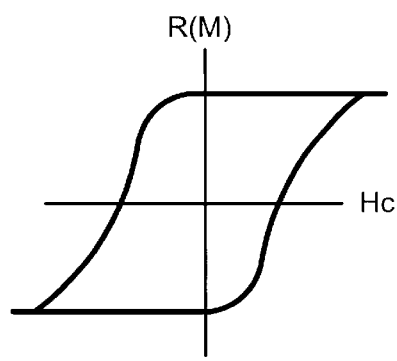
FIG. 2b

THERMALLY-ASSISTED SWITCHING OF MAGNETIC MEMORY ELEMENTS

BACKGROUND

The present invention relates to information storage devices. More specifically, the present invention relates to a Magnetic Random Access Memory ("MRAM") device.

Consider the example of an MRAM device including a resistive cross point array of spin dependent tunneling (SDT) junctions, word lines extending along rows of the SDT junctions, and bit lines extending along columns of the SDT junctions. Each SDT junction is located at a cross point of a word line and a bit line. The magnetization of each SDT junction assumes one of two stable orientations at any given time. These two stable orientations, parallel and anti-parallel, represent logic values of '0' and '1.' The magnetization orientation, in turn, affects the resistance of the SDT junction. Resistance of the SDT junction is a first value (R) if the magnetization orientation is parallel and a second value (R+ΔR) if the magnetization orientation is anti-parallel. The magnetization orientation of the SDT junction and, therefore, its logic value may be read by sensing its resistance state.

A write operation on a selected SDT junction is performed by supplying write currents to the word and bit lines crossing the selected SDT junction. The currents create two external magnetic fields that, when combined, switch the magnetization orientation of the selected SDT junction from parallel to anti-parallel or vice versa.

Too small a write current might not cause the selected SDT junction to change its magnetization orientation. In theory, both external fields combined should be sufficient to flip the magnetization orientation of the selected SDT junction. In practice, however, the combined magnetic fields do not always flip the magnetization orientation. If the magnetization orientation of the selected SDT junction is not flipped, a write error is made and an increased burden on error code correction can result.

SDT junctions that see only one magnetic field (that is, SDT junctions along either a selected word line or a selected bit line) are "half-selected." In theory, a single magnetic field should not flip the magnetization orientation of an SDT junction. In practice, however, the magnetization orientation can be flipped by a single magnetic field. If the magnetization orientation of a half-selected SDT junction is flipped, an undesirable erasure occurs and an increased burden on error code correction can result.

There is a need to improve the reliability of writing to SDT junctions. More generally, there is a need to improve the reliability of writing to magnetic memory elements of MRAM devices.

SUMMARY

According to one aspect of the present invention, a magnetic memory element is written to by heating the memory element and applying at least one magnetic field to the memory element. Other aspects and advantages of the present invention will become apparent from the following detailed description, taken in conjunction with the accompanying drawings, illustrating by way of example the principles of the present invention.

BRIEF DESCRIPTION OF THE DRAWINGS

FIG. 1 is an illustration of an SDT junction;

FIGS. 2a and 2b are illustrations of hysteresis loops for the SDT junction;

DETAILED DESCRIPTION

Figure 3:
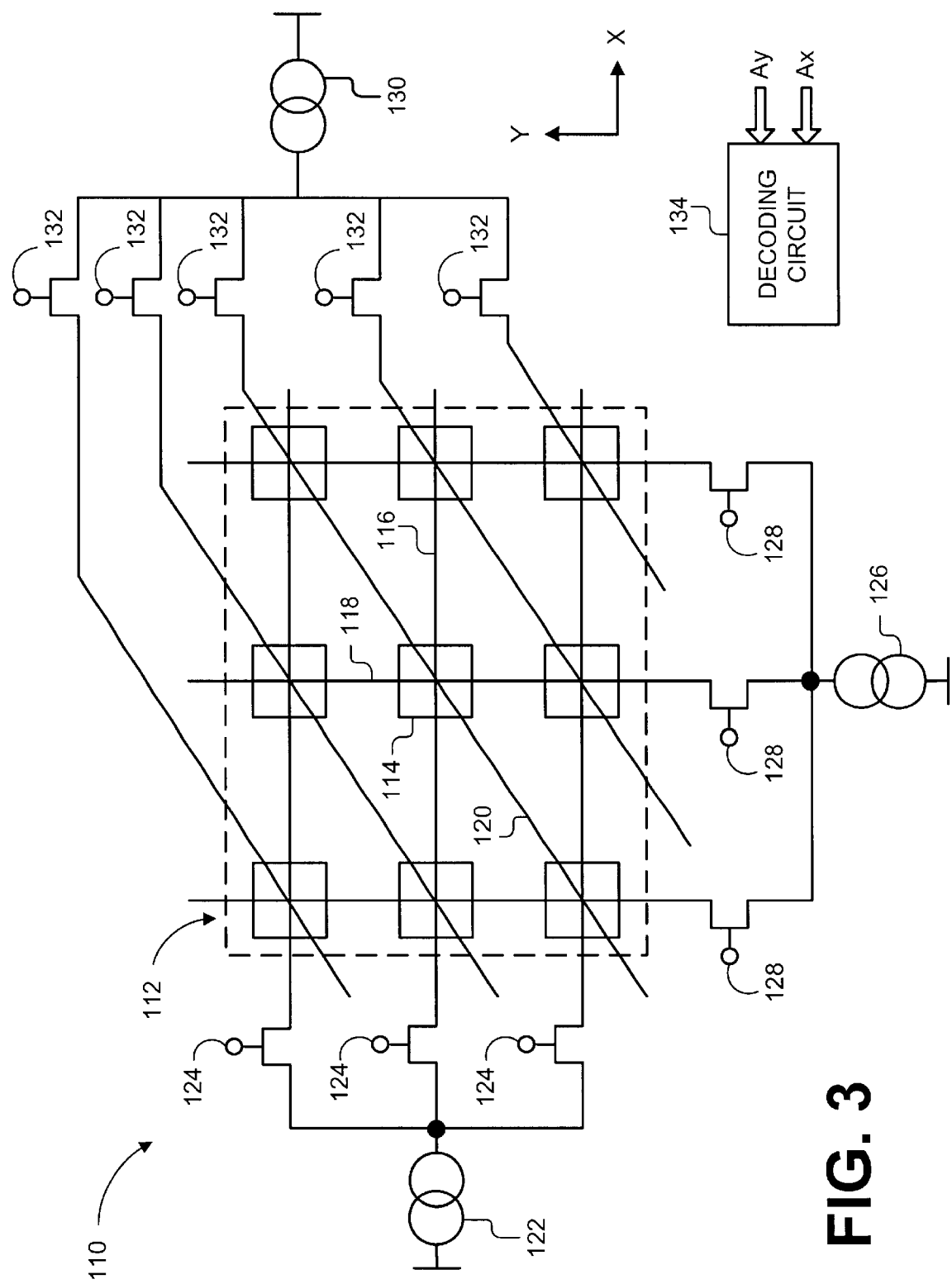
FIG. 3 is an illustration of an MRAM device that can perform thermally-assisted switching.

As shown in the drawings for purposes of illustration, the present invention is embodied in an MRAM device including an array of magnetic memory elements. During data storage, the MRAM device performs thermally-assisted switching of selected memory elements. The thermally-assisted switching improves the reliability of storing data in the MRAM device.

A magnetic memory element of the MRAM device could be any element having a resistance that is dependent upon the state of its magnetic film. Examples of such elements include magnetic tunnel junctions (the SDT junction is a type of magnetic tunnel junction) and giant magnetoresistance ("GMR") spin valves. For the purposes of illustration, the memory elements will be described below as SDT junctions Reference is made to FIG. 1, which shows an SDT junction 10. The SDT junction 10 includes a pinned layer 12 having a magnetization that is oriented in the plane of the pinned layer 12 but fixed so as not to rotate in the presence of an applied magnetic field in a range of interest. The SDT junction 10 also includes a "free" layer 14 having a magnetization orientation that is not pinned. Rather, the magnetization can be oriented in either of two directions along an axis (the "easy" axis) lying in the plane of the free layer 14. If the magnetization of the pinned and free layers 12 and 14 are in the same direction, the orientation is said to be "parallel" (as indicated by the arrow P). If the magnetization of the pinned and free layers 12 and 14 are in opposite directions, the orientation is said to be "anti-parallel" (as indicated by the arrow A).

The pinned and free layers 12 and 14 are separated by an insulating tunnel barrier 16. The insulating tunnel barrier 16 allows quantum mechanical tunneling to occur between the pinned and free layers 12 and 14. This tunneling phenomenon is electron spin dependent, making the resistance of the SDT junction 10 a function of the relative orientations of the magnetization of the pinned and free layers 12 and 14. For instance, resistance of the SDT junction 10 is a first value (R) if the magnetization orientation of the pinned and free layers 12 and 14 is anti-parallel and a second value (R+ΔR) if the magnetization orientation is parallel.

Magnetic fields (Hx, Hy) may be applied to the SDT junction 10 by supplying currents (Iy, Ix) to first and second conductors 18 and 20 contacting the SDT junction 10. If the conductors 18 and 20 are orthogonal, the applied magnetic fields (Hx, Hy) will also be orthogonal.

When sufficiently large currents (Ix, Iy) are passed through the conductors B and 20, the combined magnetic field (Hy+Hx) in the vicinity of the free layer 14 causes the magnetization of the free layer 14 to rotate from the parallel orientation the anti-parallel orientation, or vice-versa. For example, a sufficient current 1x will cause the magnetization orientation to be anti-parallel, whereas a sufficient current Iy will cause the magnetization orientation to be parallel.

Current magnitudes may be selected so that the combined magnetic field (Hx+Hy) exceeds the switching field of the free layer 14 but does not exceed the switching field of the pinned layer 12.

However, the magnitude of one or both write currents (Ix, Iy) may be reduced if the SDT junction 10 is heated. Coercivity of a magnetic film decreases with increasing temperature. Raising the temperature of the SDT junction 10 reduces the coercivity (Hc) of the SDT junction 10, as shown in FIGS. 2a and 2b. FIG. 2a shows the coercivity (Hc) at room temperature, while FIG. 2b shows the coercivity (Hc) at 50° C. above room temperature. At the elevated temperature, the SDT junction 10 switches from a high resistance state to a low resistance state and vice-versa in the presence of a lower combined magnetic field (Hx+Hy). Therefore, heating the SDT junction 10 allows the magnitudes of one or both of the write currents (Ix, Iy) to be reduced. If, on the other hand, the magnitudes of the write currents (Ix, Iy) are not reduced, the SDT junction 10 will switch more reliably in the presence of the combined magnetic field (Hx+Hy). The temperature and write current can be varied to achieve a desired switching reliability.

Heat may be applied and removed before the combined magnetic field (Hx+Hy) is applied, or the heat may be applied at the same time as the combined magnetic field (Hx+Hy). The free layer 14 may be heated to about 10° C. to 50° C. above ambient. More generally, the maximum heating temperature may be about 50° C. less than the Blocking temperature $T_B$ (the temperature above which the anti-ferromagnetic layer looses its pinning properties).

Returning to FIG. 1, the heat may be applied to the free layer 14 by a third conductor 22, which is separated from the first conductor 18 by a layer 24 of an electrically insulating, thermally conductive material (e.g., silicon nitride). Even though the current flowing through the third conductor 22 creates an additional magnetic field, the third conductor 22 is far enough away from the SDT junction 10 so that the additional magnetic field does not adversely affect the switching.

Although FIG. 1 shows the third conductor 22 being above the SDT junction 10, the third conductor 22 may instead be below the SDT junction 10. Third conductors 22 may even be above and below the SDT junction 10.

Reference is now made to FIG. 3, which illustrates an information storage device 110 including a resistive cross point array 112 of memory elements 114. The memory elements 114 are arranged in rows and columns, with the rows extending along an x-direction and the columns extending along a y-direction. Only a relatively small number of memory elements 114 is shown to simplify the illustration of the information storage device 110. In practice, arrays of any size may be used.

Traces functioning as word lines 116 extend along the x-direction in a plane on one side of the memory cell array 112. Traces functioning as bit lines 118 extend along the y-direction in a plane on an adjacent side of the memory cell array 112. There may be one word line 116 for each row of the array 112 and one bit line 118 for each column of the array 112. Each memory element 114 is located at a cross point of a word line 116 and a bit line 118.

Traces functioning as heating lines 120 extend diagonally across the array 112. The heating lines 120 may be provided on the top of the array 112, on the bottom of the array 112 or on both the top and the bottom of the array 112. An exemplary construction of a heating line 120 is described below in connection with FIG. 4.

The information storage device 110 includes a read circuit for sensing the resistance states of selected memory elements 114 during read operations and a write circuit for supplying write currents to selected word lines 116, bit lines 118 and heating lines 120 during write operations. The read circuit is not shown in order to simplify the illustration of the information storage device 110.

The write circuit includes a first current source 122 coupled to the word lines 116 by a first group of transistors 124, a second current source 126 coupled to the bit lines 118 by a second group of transistors 128, and a third current source 130 coupled to the heating lines 120 by a third group of transistors 132.

During a write operation, a decoder 134 decodes addresses Ax and Ay to select a word line 116, a bit line 118 and a heating line 120. The decoder 134 selects a word line 116 by commanding a transistor 124 of the first group to connect the word line 116 to the first current source 122, a bit line 118 by commanding a transistor 128 of the second group to connect the bit line 118 to the second current source 126, and a heating line 120 by commanding a transistor 132 of the third group to connect the heating line 120 to the third current source 130. Currents flow through the selected word, bit and heating lines 116, 118 and 120. The memory element 114 at the crosspoint of the selected word and bit lines 116 and 118 is exposed to the combined magnetic field (Hx+Hy). This selected memory element 114 is also heated by the selected heating line 120. An advantage of diagonally-extending heating lined 120 is that the selected element is heated, but the half-selected elements are not.

FIG. 3 shows a single current source 122 for the word lines 116, a single current source 126 for the bit lines 118, and a single current source 130 for the heating lines 120. In large arrays, multiple current sources 122 may be provided for the word lines 116, multiple current sources 126 may be provided for the bit lines 118, and multiple currents sources 130 may be provided for the heating lines 120, whereby each current source 122 is shared by multiple word lines 116, each current source 126 is shared by multiple bit lines 118, and each current source 130 is shared by multiple heating lines 120. This allows simultaneous writes to multiple memory elements 114.

Other elements of the write circuit are not shown. For example, FIG. 3 does not show transistors for connecting "free ends" of the word, bit and heating lines 116, 118 and 120 to a reference potential. Moreover, the transistors 124, 128 and 132 and current sources shown in FIG. 3 are a simplification of the write circuit. Circuitry for supplying current to word, bit and heating lines 116, 118 and 120 may be implemented in a variety of different ways.

Figure 4:
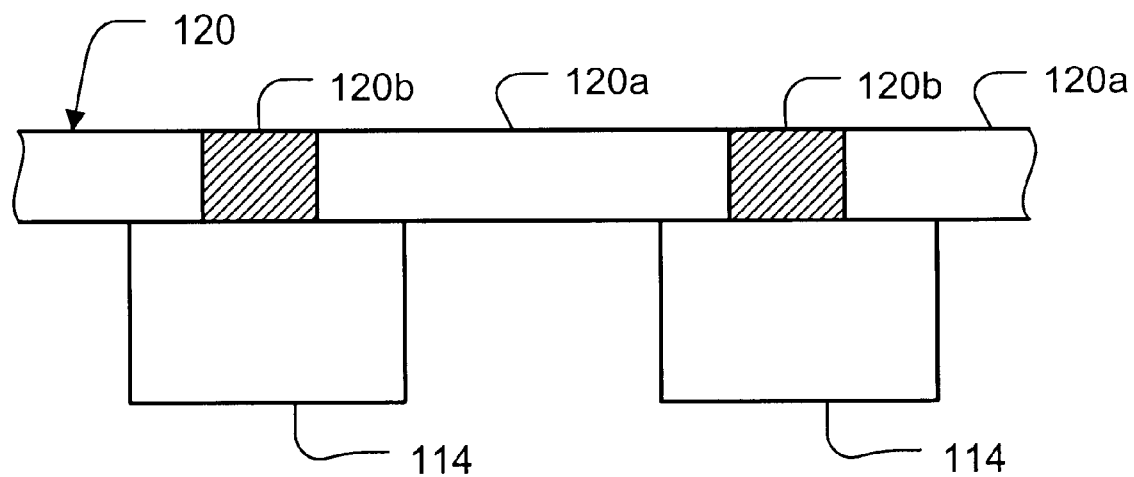
FIG. 4 is an illustration of a heating line for the MRAM device.

Reference is now made to FIG. 4, which shows an exemplary construction of the heating line 120. The heating line 120 includes copper traces 120a separated by heating elements 120b made of tungsten or platinum or other highly resistive metal. The heating elements 120b are positioned over the memory elements 114.

FIGS. 5a, 5b, 5c and 5d show different patterns for the heating lines 120. In these patterns the heating lines 120 extend diagonally across the array 112. Moreover, groups of heating lines 120 are tied together to form loops. Current is supplied to one end of a loop and the other end of the loop is tied to a reference potential. This reduces the number of transistors. It also allows heat to be applied to multiple elements crossed by the same bit line.

Figure 5A:
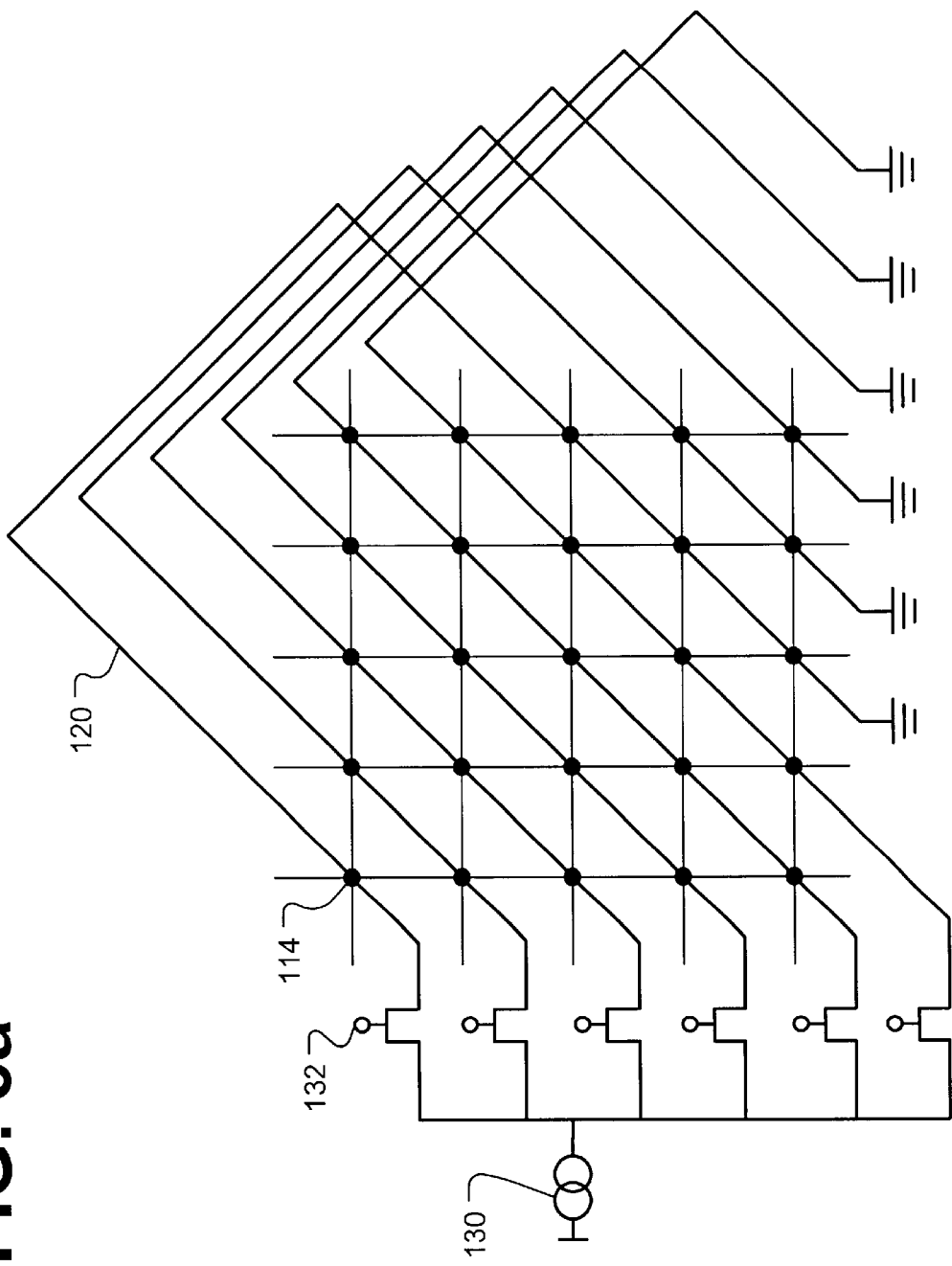
FIGS. 5a, 5b, 5c and 5d are illustrations of different patterns of heating lines for the MRAM device.

FIG. 5a shows the heating lines 120 arranged in a plurality of paths. Each path includes a pair of series-connected heating lines 120. One end of each path is tied to a reference potential, and the other end of each path is coupled to a current source 130 by a transistor 132. In this configuration heat is applied to the selected memory element 114 but not to half-selected memory elements 114. This configuration improves the half-select margin and reduces the likelihood of unwanted erasures.

Figure 5B:
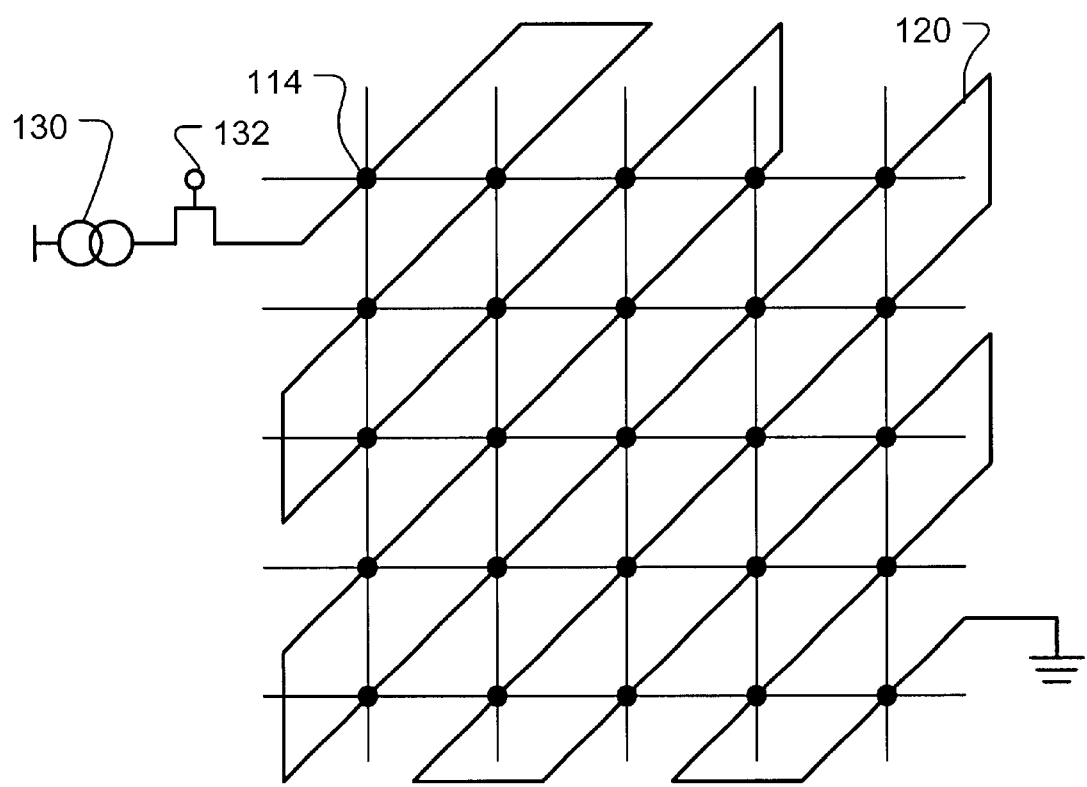

FIG. 5b shows multiple heating lines 120 connected in series to form a single path. One end of the single path is tied to a reference potential, and the other end of the single path is coupled to a current source 130 by a transistor 132. Each heating line 120 covers memory elements 114 in adjacent rows.

Figure 5C:
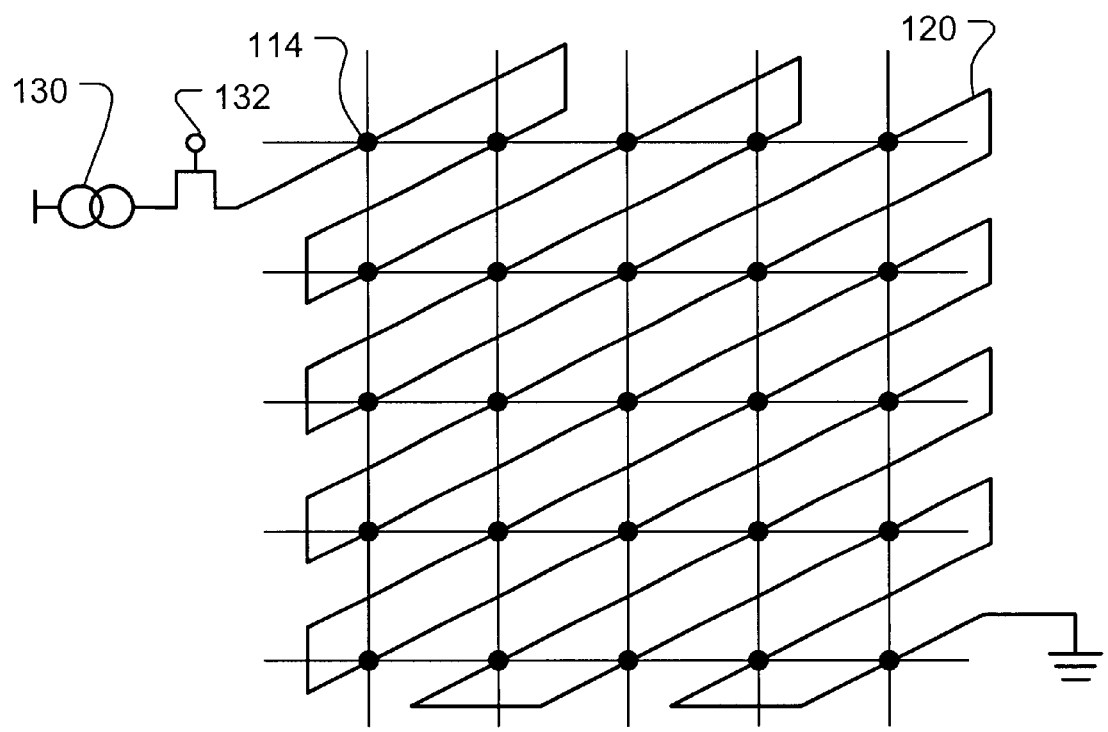

FIG. 5c shows a pattern similar to that shown in FIG. 5b, except that the angle of the heating lines 120 is different. The heating lines of FIG. 5c do not cover memory elements 114 in adjacent rows. Instead, each heating line 120 covers a memory element 114 in every other column.

Figure 5D:
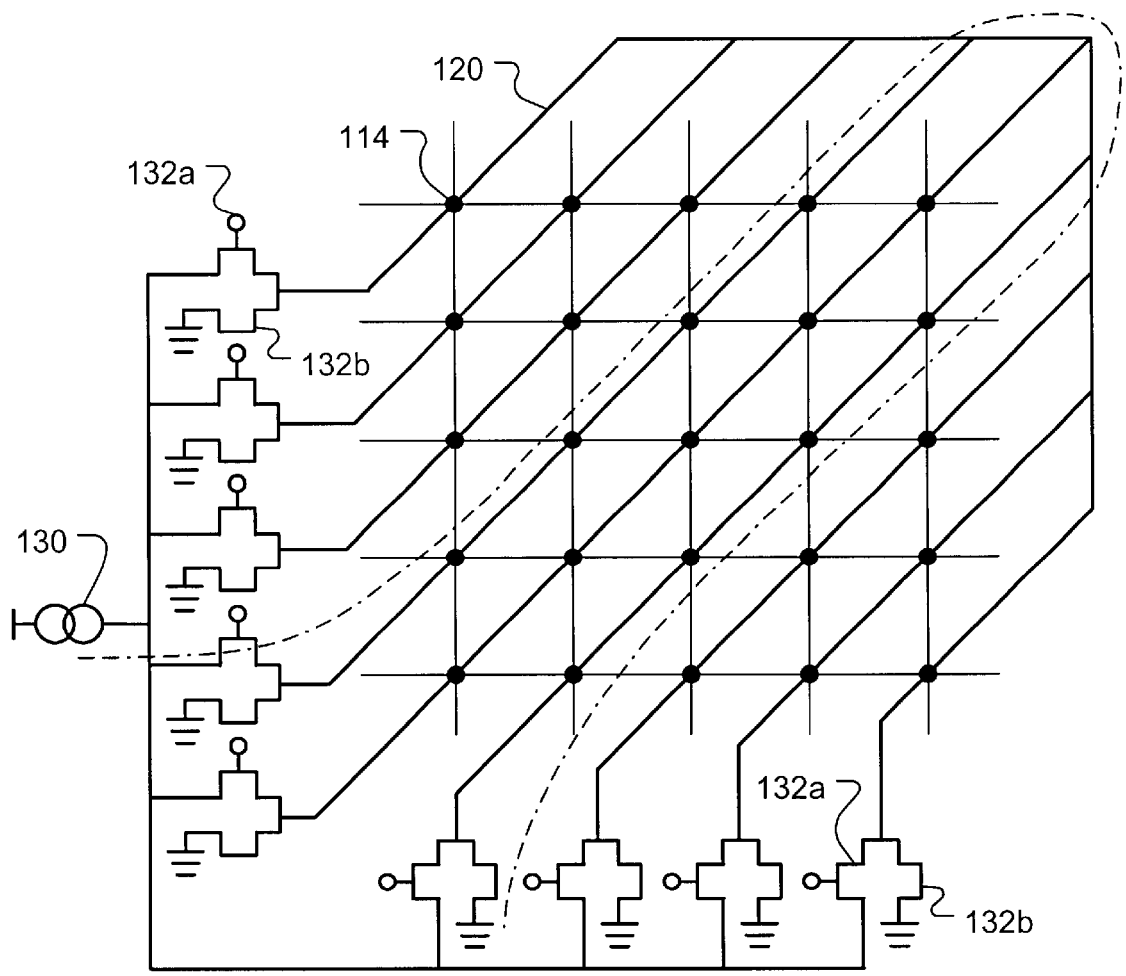

FIG. 5d shows multiple heating lines having first ends that are tied together. Switches 132a allow currents to be supplied to selected second ends of the heating lines, and switches 132b allow other selected second ends to be connected to a reference potential. This arrangement allows any two heating lines 120 to be selected to form a path. For example, switches 132a and 132b could be selected to form a current path indicated by the dashed line.

The switches 132a and 132b may be selected to allow current to flow through multiple heating lines 120 in parallel. This configuration allows for simultaneous writes.

Blocks of the patterns described above may be repeated across a large array. For example, a large array might include a plurality of write circuits and groups of bit lines coupled to each write circuit. A pattern of heating lines 120 may be applied to each group of bit lines.

Figure 6:
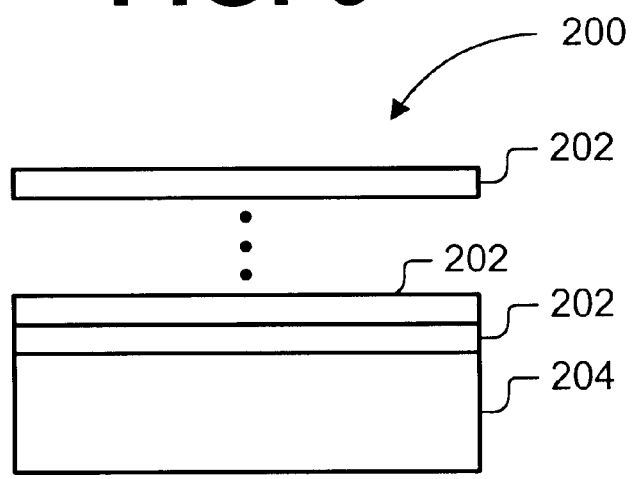
FIG. 6 is an illustration of a multi-level MRAM chip.

Reference is now made to FIG. 6, which illustrates a chip 200 having multiple levels or planes 202 of resistive cross point memory cell arrays. The planes 202 are stacked on a substrate 204 and separated by insulating material (not shown) such as silicon dioxide. Read and write circuits may be fabricated on the substrate 204. The read and write circuits may include additional multiplexers for selecting the levels that are read from and written to. The current sources may be on-chip or off-chip.

The information storage device according to the present invention may be used in a wide variety of applications. For example, the information storage device may be used for long-term data storage in a computer. Such a device offers many advantages (e.g., faster speed, smaller size) over hard drives and other conventional long-term data storage devices.

The information storage device according to the present invention may be used in digital cameras for long-term storage of digital images. The information storage device according to the present invention may even replace DRAM and other fast, short-term memory in computers.

The information storage device according to the present invention is not limited to switching a memory element by applying two orthogonal magnetic fields to the memory element. For example, a selected memory element may be switched by heat and only a single magnetic field.

The present invention is not limited to the specific embodiments described and illustrated above. Instead, the present invention is construed according to the claims that follow.

What is claimed is:

1. An information storage device comprising:

an array of magnetic memory elements; and a plurality of heating lines extending across the array, the heating lines including heating elements for the memory elements, wherein the heating lines extend diagonally across the array.

2. An information storage device comprising:

an array of magnetic memory elements; and a plurality of heating lines extending across the array, the heating lines including heating elements for the memory elements, wherein groups of heating lines are connected together to form at least one path.

3. The device of claim 2, wherein the heating lines of each group are connected in series.

4. The device of claim 3, further comprising switches for allowing currents to be supplied to one end of each path.

5. An information storage device comprising:

an array of magnetic memory elements; and a plurality of heating lines extending across the array, the heating lines including heating elements for the memory elements, wherein the heating lines have first ends that are tied together.

6. The device of claim 5, further comprising switches for allowing currents to be supplied to selected second ends of the heating lines.

7. The device of claim 6, wherein the switches also couple second ends of the heating lines to a reference potential.

8. The device of claim 6, wherein the switches allow currents to be supplied to heating lines in parallel.

9. An information storage device comprising:

an array of spin dependent tunneling (SDT) junctions; and a plurality of heating elements for the SDT junctions, further comprising first means for generating magnetic fields for switching of selected SDT junctions; and second means for causing the heating elements to apply heat to the selected SDT junctions while the magnetic fields are being applied.

10. An information storage device comprising:

an array of magnetic memory elements;

a plurality of heating elements for the memory elements;

first means for generating magnetic fields for switching of selected memory elements; and second means for causing the heating elements to apply heat to the selected memory elements before the magnetic fields are applied.

* * * * *